United States Patent
Saito

(10) Patent No.: US 9,209,255 B2
(45) Date of Patent: Dec. 8, 2015

(54) SEMICONDUCTOR DEVICE INCLUDING AN ELECTRODE STRUCTURE FORMED ON NITRIDE SEMICONDUCTOR LAYERS

(71) Applicant: Kabushiki Kaisha Toshiba, Minato-ku (JP)

(72) Inventor: Hisashi Saito, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/463,998

(22) Filed: Aug. 20, 2014

(65) Prior Publication Data

US 2015/0069469 A1   Mar. 12, 2015

(30) Foreign Application Priority Data

Sep. 10, 2013   (JP) .................................. 2013-187764

(51) Int. Cl.
| | |
|---|---|
| H01L 29/20 | (2006.01) |
| H01L 29/423 | (2006.01) |
| H01L 29/778 | (2006.01) |
| H01L 29/66 | (2006.01) |
| H01L 29/40 | (2006.01) |

(52) U.S. Cl.
CPC ...... *H01L 29/2003* (2013.01); *H01L 29/66462* (2013.01); *H01L 29/7786* (2013.01); *H01L 29/402* (2013.01); *H01L 29/42376* (2013.01)

(58) Field of Classification Search
CPC ............ H01L 29/2003; H01L 29/4232; H01L 29/7786
See application file for complete search history.

(56) References Cited

U.S. PATENT DOCUMENTS

| | | | |
|---|---|---|---|
| 2007/0158692 A1 | 7/2007 | Nakayama et al. | |
| 2009/0206373 A1 | 8/2009 | Yafune et al. | |
| 2012/0032188 A1* | 2/2012 | Kanamura et al. | 257/76 |
| 2012/0217544 A1* | 8/2012 | Ohki | 257/194 |
| 2013/0234152 A1 | 9/2013 | Yumoto | |

FOREIGN PATENT DOCUMENTS

| | | |
|---|---|---|
| JP | 2009-164339 A | 7/2009 |
| JP | 2010-165896 A | 7/2010 |
| JP | 2011-249824 | 12/2011 |
| JP | 2012-175018 A | 9/2012 |
| JP | 2013-187219 A | 9/2013 |

* cited by examiner

*Primary Examiner* — Thanh V Pham
(74) *Attorney, Agent, or Firm* — Oblon, McClelland, Maier & Neustadt, L.L.P.

(57) ABSTRACT

According to one embodiment, a semiconductor device includes a nitride semiconductor layer, a first electrode provided on the layer, a second electrode provided on the layer, a insulating film provided on the layer, a first control electrode provided on the film, and a conductor provided on the film. The first control electrode includes a first edge, and a second edge. The first edge is provided between the second edge and the first electrode. The conductor includes a first portion and a third edge positioned between the first portion and the first electrode. An electric field strength at a first region is substantially equal to an electric field strength at a second region. The first region overlaps the first edge when projected onto a plane perpendicular to a stacking direction. The second region overlaps the third edge when projected onto the plane.

20 Claims, 9 Drawing Sheets

SEMICONDUCTOR DEVICE INCLUDING AN ELECTRODE STRUCTURE FORMED ON NITRIDE SEMICONDUCTOR LAYERS

CROSS-REFERENCE TO RELATED APPLICATIONS

This application is based upon and claims the benefit of priority from Japanese Patent Application No. 2013-187764, filed on Sep. 10, 2013; the entire contents of which are incorporated herein by reference.

FIELD

Embodiments described herein relate generally to a semiconductor device.

BACKGROUND

In a semiconductor device that uses a nitride semiconductor, a phenomenon called current collapse may occur in which the current decreases when a high electric field is applied. To avoid such a phenomenon, a field plate electrode structure is used to disperse the electric field in the element interior. On the other hand, the field plate electrode structure causes the parasitic capacitance to increase which may cause an increase of the switching loss. In such a semiconductor device using a nitride semiconductor, it is important to realize both the suppression of the current collapse and the reduction of the switching loss.

DETAILED DESCRIPTION

Figure 1A:
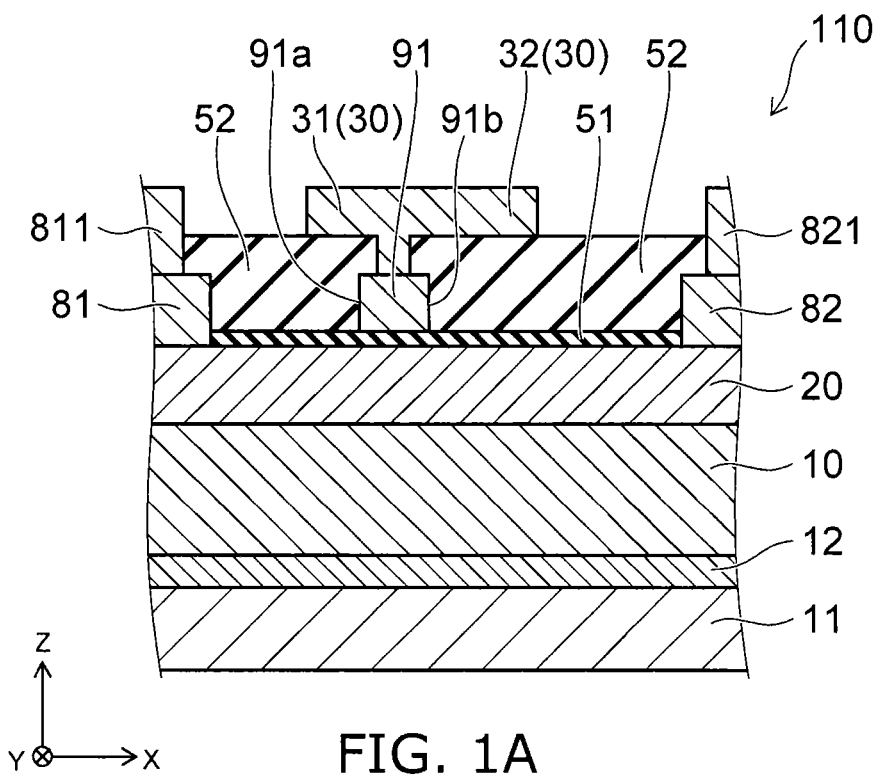
FIGS. 1A and 1B are schematic views showing a semiconductor device according to a first embodiment.

According to one embodiment, a semiconductor device includes a first nitride semiconductor layer, a second nitride semiconductor layer, a first electrode, a second electrode, a first insulating film, a first control electrode, a second insulating film, and a conductor. The second nitride semiconductor layer is provided on the first nitride semiconductor layer. A bandgap of the second nitride semiconductor layer is not less than a bandgap of the first nitride semiconductor layer. The first electrode is provided on the second nitride semiconductor layer. The second electrode is provided on the second nitride semiconductor layer and separated from the first electrode. The first insulating film is provided on the second nitride semiconductor layer. The first control electrode is provided on the first insulating film between the first electrode and the second electrode. The first control electrode includes a first edge, and a second edge separated from the first edge. A distance between the first control electrode and the first electrode is shorter than a distance between the first control electrode and the second electrode. The first edge is provided between the second edge and the first electrode in a first direction from the first electrode toward the second electrode. The second insulating film is provided between the first control electrode and the first electrode and between the first control electrode and the second electrode. The conductor is provided on the second insulating film. The conductor includes a first portion having a first length in the first direction, and a third edge positioned between the first portion and the first electrode in the first direction. An electric field strength at a first region is substantially equal to an electric field strength at a second region. The first region overlaps the first edge when projected onto a plane perpendicular to a second direction from the first nitride semiconductor layer toward the second nitride semiconductor layer. The second region overlaps the third edge when projected onto the plane.

According to one embodiment, a semiconductor device includes a first nitride semiconductor layer, a second nitride semiconductor layer, a first electrode, a second electrode, a first insulating film, a first control electrode, a second insulating film, and a conductor. The second nitride semiconductor layer is provided on the first nitride semiconductor layer. A bandgap of the second nitride semiconductor layer is not less than a bandgap of the first nitride semiconductor layer. The first electrode is provided on the second nitride semiconductor layer. The second electrode is provided on the second nitride semiconductor layer and is separated from the first electrode. The first insulating film is provided on the second nitride semiconductor layer. The first control electrode is provided on the first insulating film between the first electrode and the second electrode. The first control electrode includes a first edge and a second edge separated from the first edge. A first capacitance is formed between the first control electrode and the second nitride semiconductor layer. A distance between the first control electrode and the first electrode is shorter than a distance between the first control electrode and the second electrode. The first edge is provided between the second edge and the first electrode in a first direction from the first electrode toward the second electrode. The second insulating film is provided between the first control electrode and the first electrode and between the first control electrode and the second electrode. The conductor is provided on the second insulating film. The conductor includes a first portion having a first length in the first direction. A second capacitance is formed between the conductor and the second nitride semiconductor layer. The total of the first capacitance and the second capacitance is not less than 1.1 times and not more than 1.4 times the first capacitance.

According to one embodiment, a semiconductor device includes a first semiconductor device and a second semiconductor device. The first semiconductor device includes a first nitride semiconductor layer, a second nitride semiconductor layer, a first electrode, a second electrode, a first insulating film, a first control electrode, a second insulating film, and a conductor. The second nitride semiconductor layer is provided on the first nitride semiconductor layer. The first electrode is provided on the second nitride semiconductor layer. The second electrode is provided on the second nitride semiconductor layer and is separated from the first electrode. The first insulating film is provided on the second nitride semiconductor layer. The first control electrode is provided on the first insulating film between the first electrode and the second electrode. The second insulating film is provided between the first control electrode and the first electrode and between the first control electrode and the second electrode. The conductor provided on the second insulating film. A bandgap of the second nitride semiconductor layer is not less than a bandgap of the first nitride semiconductor layer. The first control electrode includes a first edge and a second edge. The second edge is separated from the first edge. A distance between the first control electrode and the first electrode is shorter than a distance between the first control electrode and the second electrode. The first edge is provided between the second edge and the first electrode in a first direction from the first electrode toward the second electrode. The conductor includes a first portion and a third edge. The first portion has a first length in the first direction. The third edge is positioned between the first portion and the first electrode in the first direction. An electric field strength at a first region is substantially equal to an electric field strength at a second region. The first region overlaps the first edge when projected onto a plane perpendicular to a second direction from the first nitride semiconductor layer toward the second nitride semiconductor layer. The second region overlaps the third edge when projected onto the plane. The second semiconductor device includes a first semiconductor region of a first conductivity type, a second semiconductor region of a second conductivity type, a third semiconductor region of the second conductivity type, a third electrode, a fourth electrode, a third insulating film, and a second control electrode. The third insulating film is provided on the first semiconductor region. The second control electrode is provided on the third insulating film. The second semiconductor region is provided at the first semiconductor region. The third semiconductor region is provided at the first semiconductor region and is separated from the second semiconductor region. The third electrode is electrically connected to the second semiconductor region and is electrically connected to the first control electrode. The fourth electrode is electrically connected to the third semiconductor region and is electrically connected to the first electrode.

According to one embodiment, a semiconductor device includes a first semiconductor device and a second semiconductor device. The first semiconductor device includes a first nitride semiconductor layer, a second nitride semiconductor layer, a first electrode, a second electrode, a first insulating film, a first control electrode, a second insulating film, and a conductor. The second nitride semiconductor layer is provided on the first nitride semiconductor layer. The first electrode is provided on the second nitride semiconductor layer. The second electrode is provided on the second nitride semiconductor layer and is separated from the first electrode. The first insulating film is provided on the second nitride semiconductor layer. The first control electrode is provided on the first insulating film between the first electrode and the second electrode. The second insulating film is provided between the first control electrode and the first electrode and between the first control electrode and the second electrode. The conductor is provided on the second insulating film. A bandgap of the second nitride semiconductor layer is not less than a bandgap of the first nitride semiconductor layer. The first control electrode includes a first edge and a second edge. The second edge is separated from the first edge. A first capacitance is formed between the first control electrode and the second nitride semiconductor layer. A distance between the first control electrode and the first electrode is shorter than a distance between the first control electrode and the second electrode. The first edge is provided between the second edge and the first electrode in a first direction from the first electrode toward the second electrode. The conductor includes a first portion having a first length in the first direction. A second capacitance is formed between the conductor and the second nitride semiconductor layer. A total of the first capacitance and the second capacitance is not less than 1.1 times and not more than 1.4 times the first capacitance. The second semiconductor device includes a first semiconductor region of a first conductivity type, a second semiconductor region of a second conductivity type, a third semiconductor region of the second conductivity type, a third electrode, a fourth electrode, a third insulating film, and a second control electrode. The third insulating film is provided on the first semiconductor region. The second control electrode is provided on the third insulating film. The second semiconductor region is provided at the first semiconductor region. The third semiconductor region is provided at the first semiconductor region and is separated from the second semiconductor region. The third electrode is electrically connected to the second semiconductor region and is electrically connected to the first control electrode. The fourth electrode is electrically connected to the third semiconductor region and is electrically connected to the first electrode.

Various embodiments will be described hereinafter with reference to the accompanying drawings. In the description hereinbelow, similar members are marked with like reference numerals, and a description is omitted as appropriate for members once described. In the description hereinbelow, a specific example is illustrated as an example in which the first conductivity type is taken to be an p-type and the second conductivity type is taken to be a n-type.

First Embodiment

Figure 1B:
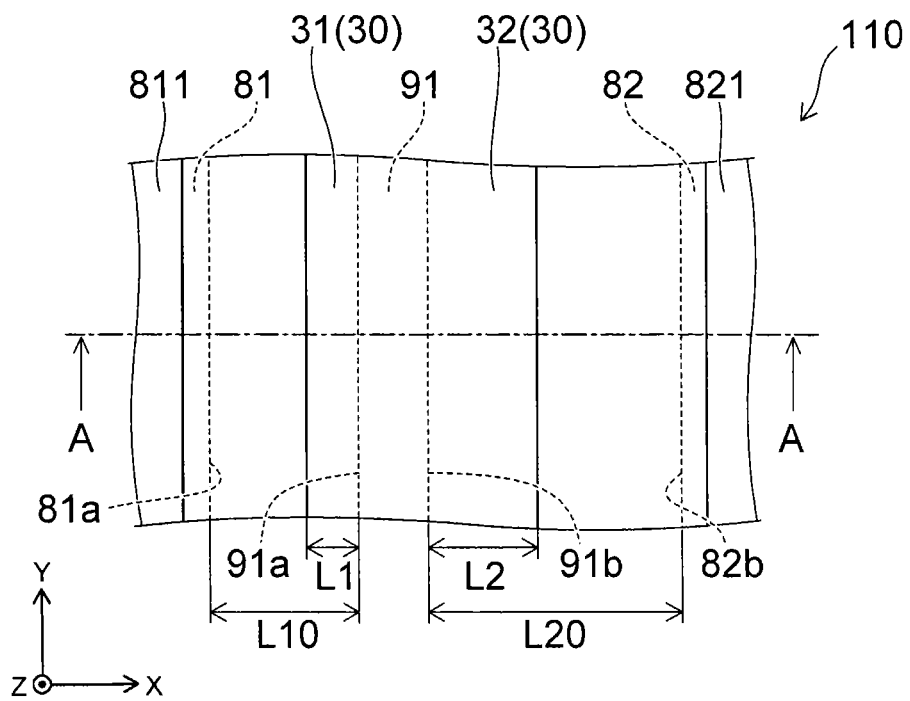

FIGS. 1A and 1B are schematic views showing a semiconductor device according to a first embodiment.

FIG. 1A is a schematic cross-sectional view of the semiconductor device 110. FIG. 1A is a schematic cross-sectional view along line A-A of FIG. 1B. FIG. 1B is a schematic plan view of the semiconductor device 110.

As shown in FIG. 1A, the semiconductor device 110 includes a first nitride semiconductor layer 10, a second nitride semiconductor layer 20, a first electrode 81, a second electrode 82, a first insulating film 51, a first control electrode 91, a second insulating film 52, and an extended electrode 30. The semiconductor device 110 is, for example, a HEMT (High Electron Mobility Transistor) that uses a nitride semiconductor.

The semiconductor device 110 further includes a substrate 11. For example, a silicon substrate, a sapphire substrate, a silicon carbide substrate, a gallium nitride substrate, an aluminum nitride substrate, or a gallium oxide substrate is used as the substrate 11. The substrate 11 may be an SOI (Silicon On Insulator) substrate.

The first nitride semiconductor layer 10 is provided on the substrate 11. A buffer layer 12 may be provided between the substrate 11 and the first nitride semiconductor layer 10. The buffer layer 12 is a layer that relaxes the strain occurring due to the difference between the lattice constant of the substrate 11 and the lattice constant of the nitride semiconductor layer formed on the buffer layer 12. An example in which the buffer layer 12 is included is described in the embodiment.

The first nitride semiconductor layer 10 is provided on the buffer layer 12. The first nitride semiconductor layer 10 is an electron transport layer of the HEMT. For example, non-doped $Al_wGa_{1-w-x}In_xN$ ($0 \le w < 1$, $0 \le x \le 1$, and $0 \le w+x \le 1$) is used as the first nitride semiconductor layer 10. The thickness of the first nitride semiconductor layer 10 is, for example, not less than 0.1 μm and not more than 10 μm.

The second nitride semiconductor layer 20 is provided on the first nitride semiconductor layer 10. In the embodiment, a direction connecting the first nitride semiconductor layer 10 and the second nitride semiconductor layer 20 is taken as a Z-direction; one direction orthogonal to the Z-direction is taken as an X-direction; and a direction orthogonal to the Z-direction and the X-direction is taken as a Y-direction. For the Z-direction, the direction from the first nitride semiconductor layer 10 toward the second nitride semiconductor layer 20 is taken to be up (the upper side); and the opposite direction is taken to be down (the lower side).

The second nitride semiconductor layer 20 is an electron supply layer of the HEMT. The bandgap of the second nitride semiconductor layer 20 is not less than the bandgap of the first nitride semiconductor layer 10. For example, $Al_yGa_{1-y-z}In_zN$ ($0 < y \le 1$, $0 \le z < 1$, and $0 \le y+z \le 1$) is used as the second nitride semiconductor layer 20. The thickness of the second nitride semiconductor layer 20 is, for example, not less than 1 nanometer (nm) and not more than 50 nm.

The buffer layer 12, the first nitride semiconductor layer 10, and the second nitride semiconductor layer 20 are formed on the substrate 11 by, for example, epitaxial growth. For example, the buffer layer 12, the first nitride semiconductor layer 10, and the second nitride semiconductor layer 20 are epitaxially grown in this order on the substrate 11.

The first electrode 81 is provided on the second nitride semiconductor layer 20. The first electrode 81 is, for example, a source electrode of the HEMT. The first electrode 81 may be multiply provided. For example, the multiple first electrodes 81 are provided in stripe configurations in the X-direction. A draw-out electrode 811 is connected to the first electrode 81. The draw-out electrode 811 is provided from the upper surface of the first electrode 81 to a position higher than the second insulating film 52.

The second electrode 82 is provided on the second nitride semiconductor layer 20. The second electrode 82 is provided to be distal to the first electrode 81 in the X-direction. The second electrode 82 is, for example, a drain electrode of the HEMT. The second electrode 82 may be multiply provided. For example, the multiple second electrodes 82 are provided in stripe configurations in the X-direction. A draw-out electrode 821 is connected to the second electrode 82. The draw-out electrode 821 is provided from the upper surface of the second electrode 82 to a position higher than the second insulating film 52.

The first insulating film 51 is provided on the second nitride semiconductor layer 20. The first insulating film 51 is a gate insulator film of the HEMT. In the semiconductor device 110, the first insulating film 51 is provided on the second nitride semiconductor layer 20 between the first electrode 81 and the second electrode 82. The first insulating film 51 includes, for example, $SiO_2$, $Si_3N_4$, $Al_2O_3$, and SiON.

The first control electrode 91 is provided on the first insulating film 51. The first control electrode 91 is a gate electrode of the HEMT. The first control electrode 91 is provided between the first electrode 81 and the second electrode 82. The first control electrode 91 may be multiply provided. For example, the multiple first control electrodes 91 are provided in stripe configurations in the X-direction. The first control electrode 91 is disposed closer to the first electrode 81 side between the first electrode 81 and the second electrode 82. A first capacitance C1 is formed between the first control electrode 91 and the second nitride semiconductor layer 20.

The first control electrode 91 includes a first edge (an end surface 91a), and a second edge (an end surface 91b) that is distal to the first edge. The first edge is provided between the second edge and the first electrode 81 in a first direction (the X-direction) from the first electrode 81 toward the second electrode 82.

The second insulating film 52 is provided between the first control electrode 91 and the first electrode 81 and between the first control electrode 91 and the second electrode 82. The second insulating film 52 is, for example, an inter-layer insulating film. The second insulating film 52 includes, for example, SiN, SiON, and $SiO_2$.

The extended electrode 30 is provided on the second insulating film 52. The extended electrode 30 is a conductor. A second capacitance C2 is formed between the extended electrode 30 and the second nitride semiconductor layer 20. In the semiconductor device 110, the extended electrode 30 is electrically connected to the first control electrode 91. The extended electrode 30 includes a first extended portion (a first portion) 31. The extended electrode 30 may include a second extended portion (a second portion) 32.

The first extended portion 31 extends in a direction (the X-direction) from the first control electrode 91 toward the first electrode 81. The first extended portion 31 is, for example, a source-side field plate electrode. The second extended portion 32 extends in a direction (the X-direction) from the first control electrode 91 toward the second electrode 82. The second extended portion 32 is, for example, a drain-side field plate electrode.

The extended electrode 30 includes a third edge (an end surface 31a). The third edge is provided between the first extended portion 31 and the first electrode 81 in the first direction (the X-direction).

As shown in FIG. 1B, the first extended portion 31 has a first length L1 in the direction from the first control electrode 91 toward the first electrode 81. The first length L1 is the length of the portion of the first extended portion 31 extending from the end surface 91a on the first electrode 81 side of the first control electrode 91 toward the first electrode 81 side as viewed from the Z-direction.

As shown in FIG. 1B, the second extended portion 32 has a second length L2 in the direction from the first control electrode 91 toward the second electrode 82. The second length L2 is the length of the portion of the second extended portion 32 extending from the end surface 91b on the second electrode 82 side of the first control electrode 91 toward the first electrode 81 side as viewed from the Z-direction.

In the semiconductor device 110, it is desirable for the first length L1 to be shorter than the second length L2. It is favorable for the first length L1 to be, for example, not less than 10% and not more than 50% of a length L10 in the X-direction between the end surface 91a on the first electrode 81 side of the first control electrode 91 and an end surface 81a on the first control electrode 91 side of the first electrode 81.

It is favorable for the second length L2 to be, for example, not less than 10% and not more than 50% of a length L20 in the X-direction between the end surface 91b on the second electrode 82 side of the first control electrode 91 and an end surface 82b on the first control electrode 91 side of the second electrode 82. In the semiconductor device 110, L10 is shorter than L20. In other words, the first control electrode 91 is provided on the first electrode 81 side of the position of the middle between the first electrode 81 and the second electrode 82 in the X-direction. Thereby, the electric field that is applied between the first control electrode 91 and the second electrode 82 is relaxed; and the breakdown voltage is increased.

The distance between the first control electrode 91 and the first electrode 81 is shorter than the distance between the first control electrode 91 and the second electrode 82.

In the semiconductor device 110, a channel region is formed of a two-dimensional electron gas (2DEG) by free electrons accumulating in the potential quantum well formed between the first nitride semiconductor layer 10 and the second nitride semiconductor layer 20. By applying a voltage to the first control electrode 91, the concentration of the two-dimensional electron gas changes. By changing the voltage applied to the first control electrode 91 in a state in which a positive voltage is applied to the second electrode 82, a drain current corresponding to the change is obtained.

In such a semiconductor device 110, the total of the first capacitance C1 and the second capacitance C2 is not less than 1.1 times and not more than 1.4 times the first capacitance C1. For example, in the semiconductor device 110, the first length L1 of the first extended portion 31 of the extended electrode 30 and the second length L2 of the second extended portion 32 of the extended electrode 30 are set to satisfy such a relationship between the first capacitance C1 and the second capacitance C2.

By the total of the first capacitance C1 and the second capacitance C2 being set to be not less than 1.1 times and not more than 1.4 times the first capacitance C1, the current collapse due to the electric field relaxation effect due to the field plate electrode structure is suppressed; and the reduction of the switching loss is achieved by suppressing the increase of the parasitic capacitance.

Figure 2:
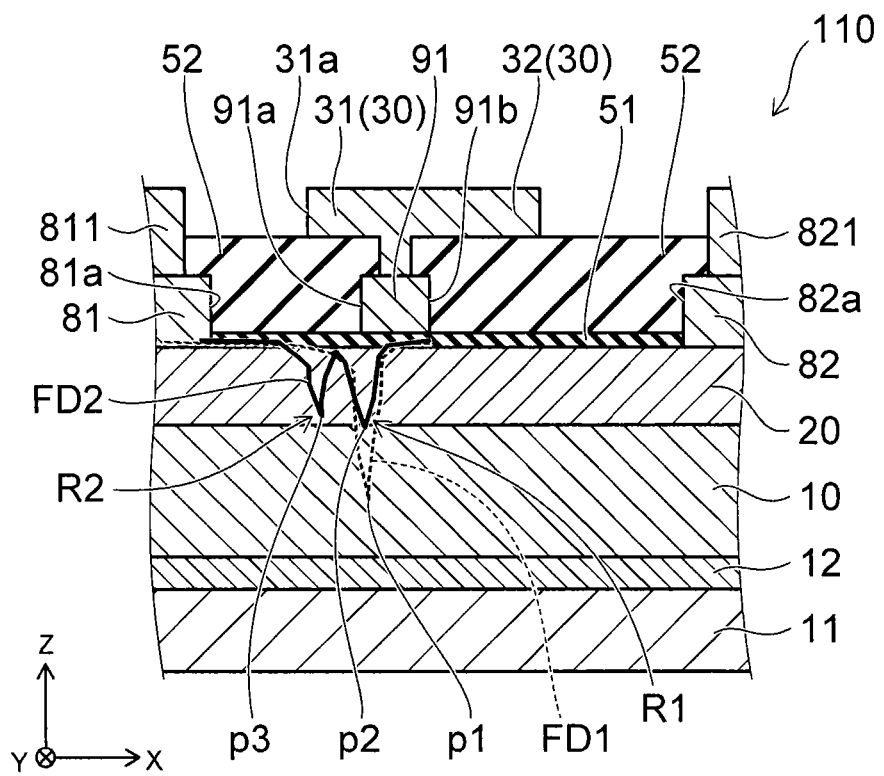
FIG. 2 is a schematic view showing electric field distributions.

FIG. 2 is a schematic view showing electric field distributions.

In FIG. 2, the electric field distributions FD1 and FD2 occur between the first control electrode 91 and the first electrode 81. For convenience of description, the electric field distributions FD1 and FD2 are overlaid on the schematic cross-sectional view of the semiconductor device 110. For both the electric field distributions FD1 and FD2 shown in FIG. 2, the electric field is stronger as the electric field distribution extends downward.

The electric field distribution FD1 is an example of the electric field distribution in a semiconductor device that does not include the extended electrode 30. In the electric field distribution FD1, a strong electric field peak p1 occurs at a position corresponding to the vicinity of the end surface 91a on the first electrode 81 side of the first control electrode 91.

The electric field distribution FD2 is an example of the electric field distribution of the semiconductor device 110 that includes the extended electrode 30. The electric field distribution FD2 has electric field peaks p2 and p3. The peak p2 of the electric field is provided at a position (a first region R1) corresponding to the vicinity of the end surface 91a on the first electrode 81 side of the first control electrode 91. The peak p3 of the electric field is provided at a position (a second region R2) corresponding to the vicinity of the end surface 31a on the first electrode 81 side of the first extended portion 31 of the extended electrode 30. The peaks p2 and p3 of the electric field are lower than the peak p1 of the electric field. In other words, the electric field distribution is dispersed by providing the extended electrode 30. Accordingly, the peaks of the electric field decrease. In the electric field distribution FD2, the electric field strength of the peak p2 is substantially equal to the electric field strength of the peak p3. Being "substantially equal" includes not only the case of being exactly the same but also the case of having a slight difference.

In other words, the electric field strength at the first region R1 overlapping the first edge (the end surface 91a) when projected onto a plane (the X-Y plane) perpendicular to the second direction (the Z-direction) is substantially equal to the electric field strength at the second region R2 overlapping the third edge (the end surface 31a) when projected onto the X-Y plane.

In the semiconductor device that does not include the extended electrode 30, current collapse may occur even in the case where a voltage applied to the first electrode 81 is higher than a voltage applied to the first control electrode 91. By providing the extended electrode 30 including the first extended portion 31 and the second extended portion 32 as in the embodiment, the capacitance between the extended electrode 30 and the first electrode 81 and the capacitance between the extended electrode 30 and the second electrode 82 are greater than in the case where the extended electrode 30 is not provided. Thereby, the electric field distribution is relaxed; and the suppression of the current collapse is achieved. Also, by increasing the capacitance between the extended electrode 30 and the first electrode 81 and the capacitance between the extended electrode 30 and the second electrode 82, an increase of the ESD (Electro Static Discharge) immunity is realized.

The current collapse of a device (hereinbelow, called the "reference device") that includes only the second extended portion 32 of the extended electrode 30 but does not include the first extended portion 31 of the extended electrode 30 will now be described. For example, when voltage stress of −30 V is continuously applied for 2 hours to the gate electrode (corresponding to the first control electrode 91) of the reference device, the on-resistance of the reference device becomes about 1.4 times the on-resistance prior to the application of the voltage stress.

By providing not only the second extended portion 32 but also the first extended portion 31 in the extended electrode 30 as in the embodiment, the reduction of the current collapse is achieved by the relaxation of the electric field distribution.

On the other hand, providing the first extended portion 31 and the second extended portion 32 in the extended electrode 30 may cause an increase of the switching loss due to the capacitance being greater than that of the reference device. Therefore, the inventors of the application discovered a novel configuration in which the reduction of the current collapse and the increase of the switching loss are suppressed.

Figure 3A:
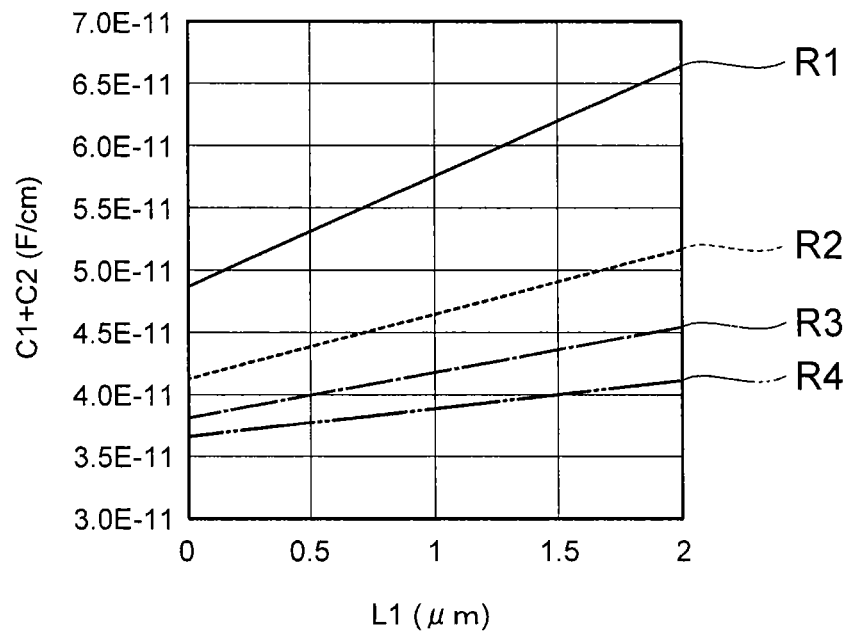
FIGS. 3A and 3B are schematic views showing changes of the capacitance.
Figure 3B:
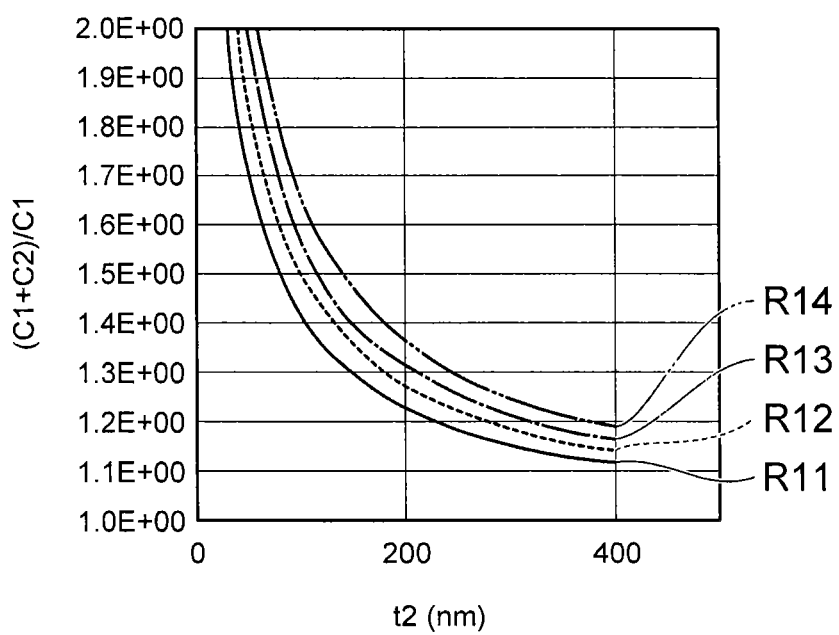

FIGS. 3A and 3B are schematic views showing changes of the capacitance.

FIG. 3A shows the relationship between the first length L1 and the capacitance. In FIG. 3A, the horizontal axis is the first length L1 (μm); and the vertical axis is the total capacitance (F/cm) of the first capacitance C1 and the second capacitance C2. FIG. 3A shows results R1, R2, R3, and R4 of simulation calculations using the second insulating film 52 having four types of film thicknesses (50 nm, 100 nm, 150 nm, and 200 nm). The second length L2 of the second extended portion 32 is 2 μm in the simulation calculations. In the simulation calculations, the capacitance is calculated by assuming a parallel plate second insulating film 52 having a dielectric constant of 7 and a material of SiN. The capacitance is calculated by capacitance=∈·S/d. Here, ∈ is the dielectric constant; S is the surface area; and d is the thickness of the dielectric film.

For each of the results R1, R2, R3, and R4, the total capacitance of the first capacitance C1 and the second capacitance C2 increases as the first length L1 of the first extended portion 31 lengthens. Also, the total capacitance of the first capacitance C1 and the second capacitance C2 increases when the film thickness of the second insulating film 52 is thin.

FIG. 3B shows the relationship between the film thickness of the second insulating film 52 and the proportion of the capacitances. In FIG. 3B, the horizontal axis is a film thickness t2 (nm) of the second insulating film 52; and the vertical axis is the proportion (C1+C2)/C1 of the total of the first capacitance C1 and the second capacitance C2 to the first capacitance C1. FIG. 3B shows results R11, R12, R13, and R14 of the simulation calculations using four types of the first length L1 (0.5 µm, 1 µm, 1.5 µm, and 2 µm) of the first extended portion 31. In the simulation calculations, the second length L2 of the second extended portion 32 is 2 µm.

For each of the results R11, R12, R13, and R14, the proportion (C1+C2)/C1 decreases as the film thickness t2 of the second insulating film 52 increases. Also, the proportion (C1+C2)/C1 increases as the first length L1 increases.

In the semiconductor device 110, by setting the proportion (C1+C2)/C1 of the capacitances to be not less than 1.1 times and not more than 1.4 times, both the reduction of the on-resistance due to the suppression of the current collapse and the reduction of the switching loss due to the capacitance reduction can be realized.

As recited above, when voltage stress of −30 V is continuously applied for 2 hours to the gate electrode of the reference device, the on-resistance of the reference device becomes about 1.4 times the on-resistance prior to the application of the voltage stress. The increase of the on-resistance may cause the increase of the switching loss. Conversely, even if there were absolutely no increase of the on-resistance, when the capacitance increases to 1.4 times, the switching loss also increases due to the capacitance increase. Therefore, in the embodiment, the proportion (C1+C2)/C1 of the capacitances is set to be 1.4 times or less.

On the other hand, the proportion of the capacitances becomes 1.1 times in the state in which the on-resistance of the reference device increases to 1.4 times. Therefore, in the embodiment, the proportion of the capacitances is set to be 1.1 times or more.

From the results of the simulation calculations shown in FIGS. 3A and 3B, it is desirable for the film thickness t2 of the second insulating film 52 to be 100 nm or more. Also, it is desirable for the first length L1 of the first extended portion 31 to be 2 µm or less.

As recited above, when voltage stress of −30 V is continuously applied for 2 hours to the gate electrode of the reference device, the on-resistance of the reference device becomes about 1.4 times the on-resistance prior to the application of the voltage stress. In other words, in the case where the first length L1 is 0 nm, the voltage stress recited above causes at least the on-resistance to become 1.4 times. The increase of the on-resistance may cause the increase of the switching loss. Conversely, in the case where it is assumed that there is no increase of the on-resistance when the first length L1 is longer than 0 nm, it is necessary to set the capacitance increase due to the parasitic capacitance occurring due to the first length L1 to be 1.4 times or less. The film thickness t2 that corresponds to the capacitance increase being 1.4 times is 100 nm. Accordingly, it is desirable for the film thickness t2 to be 100 nm or more.

Further, the relationship of the length L10 being greater than the first length L1 must exist constantly. On the other hand, the on-resistance may increase as the length L10 increases by the amount that the length L10 increases. Therefore, it is desirable for the first length L1 to be 2 µm or less.

A method for manufacturing the semiconductor device 110 will now be described.

FIG. 4A to FIG. 5C are schematic cross-sectional views showing the method for manufacturing the semiconductor device.

FIG. 4A to FIG. 5C show the method for manufacturing the semiconductor device 110 in the order of the processes.

Figure 4A:
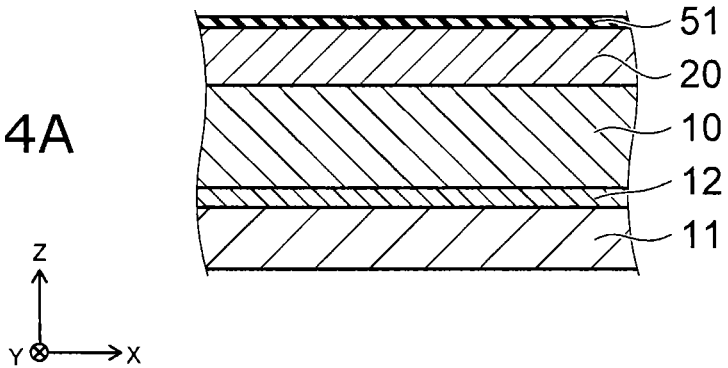
FIG. 4A to FIG. 4C are schematic cross-sectional views showing the method for manufacturing the semiconductor device.

First, as shown in FIG. 4A, the buffer layer 12 is formed on the substrate 11. For example, a stacked structure in which several tens of layers of AlN and GaN are stacked alternately is used as the buffer layer 12.

Then, the first nitride semiconductor layer 10 and the second nitride semiconductor layer 20 are stacked in this order on the buffer layer 12. For example, metal organic vapor phase deposition (MOCVD), molecular beam epitaxy (MBE), or the like is used as the method for forming the nitride semiconductor layers used to form these layers.

Continuing, the first insulating film 51 is formed on the second nitride semiconductor layer 20. The first insulating film 51 includes, for example, $SiO_2$, $Si_3N_4$, or $Al_2O_3$. A known chemical vapor deposition (CVD) method or the like is used as the film formation method of the first insulating film 51.

Figure 4B:
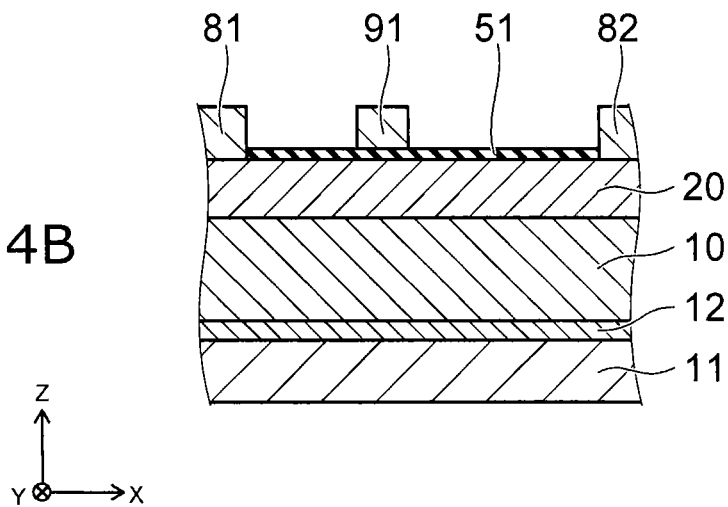

Then, as shown in FIG. 4B, the first electrode 81, the second electrode 82, and the first control electrode 91 are formed. First, openings are made in the first insulating film 51 at positions where the first electrode 81 and the second electrode 82 are to be formed. Then, the first electrode 81 and the second electrode 82 are formed in the openings. The first electrode 81 and the second electrode 82 include, for example, a stacked metal of Ti(bottom)/Al/Ni/Au(top). After forming the stacked metal, ohmic contact formation is performed by annealing.

Continuing, the first control electrode 91 is formed on the first insulating film 51. The first control electrode 91 includes, for example, a stacked metal of Ni(bottom)/Au(top). The first control electrode 91 may include Pt(bottom)/Au(top) or TiN as necessary. Also, the first control electrode 91 may include MoN, W, or WN.

Figure 4C:
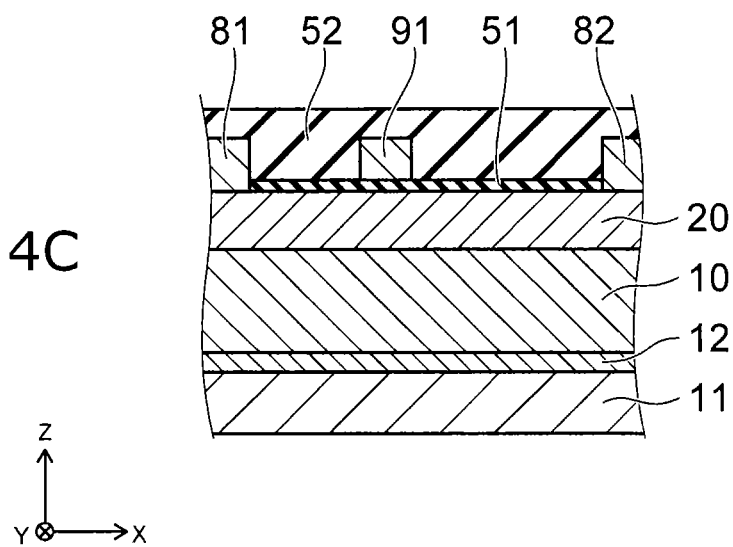

Then, as shown in FIG. 4C, the second insulating film 52 is formed on the first electrode 81, the second electrode 82, and the first control electrode 91. The second insulating film 52 includes, for example, at least one selected from SiN, SiON, and $SiO_2$. A known CVD method or the like is used as the film formation method of the second insulating film 52.

Figure 5A:
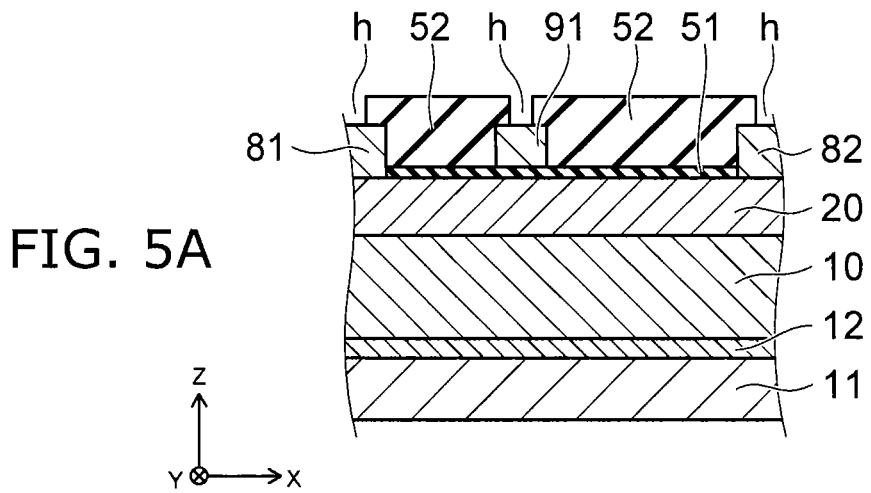
FIG. 5A to FIG. 5C are schematic cross-sectional views showing the method for manufacturing the semiconductor device.

Continuing as shown in FIG. 5A, openings h are made in the second insulating film 52. The openings h are made respectively on the first electrode 81, the second electrode 82, and the first control electrode 91. For example, known photolithography and etching methods are used as the method for making the openings h.

Figure 5B:
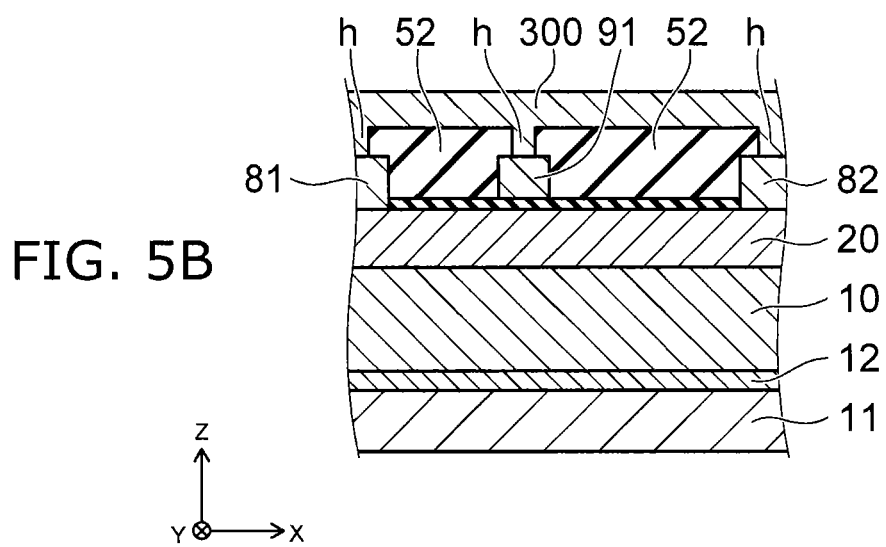

Then, as shown in FIG. 5B, an electrode material 300 is formed on the second insulating film 52 and inside the openings h. The electrode material 300 includes, for example, Ti(bottom)/Pt/Au(top). For example, vapor deposition is used as the method for forming the electrode material 300.

Figure 5C:
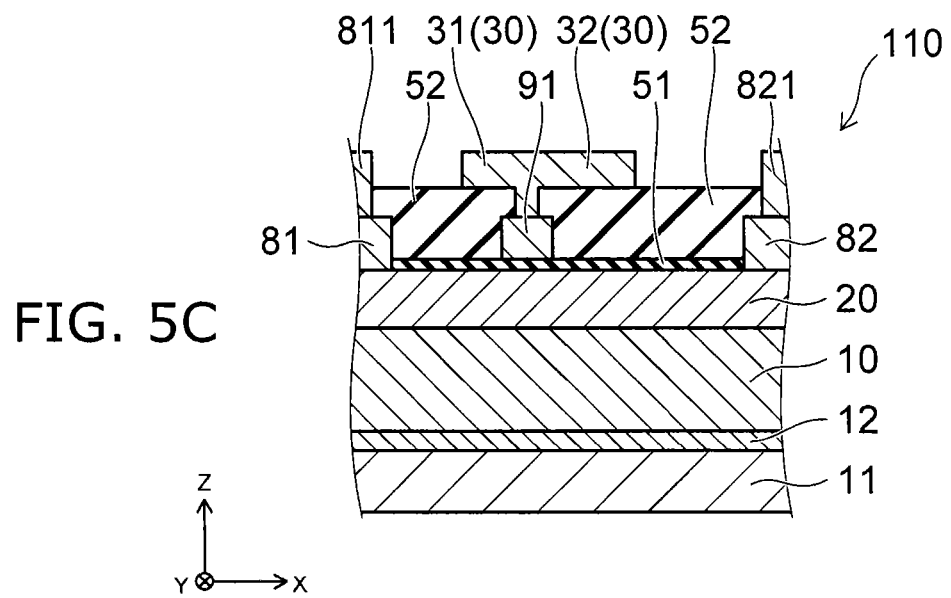

Continuing as shown in FIG. 5C, the draw-out electrode 811, the draw-out electrode 821, and the extended electrode 30 are formed. Namely, the formation of the draw-out electrode 811, the draw-out electrode 821, and the extended electrode 30 includes, for example, removing a portion of the electrode material 300 by known photolithography and etching methods. The remaining portions of the electrode material 300 that are not removed become the draw-out electrode 811, the draw-out electrode 821, and the extended electrode 30. The first length L1 of the first extended portion 31 and the second length L2 of the second extended portion 32 are determined by the photolithography and etching of the electrode material 300. Thereby, the semiconductor device 110 is completed.

Second Embodiment

A second embodiment will now be described.

Figure 6A:
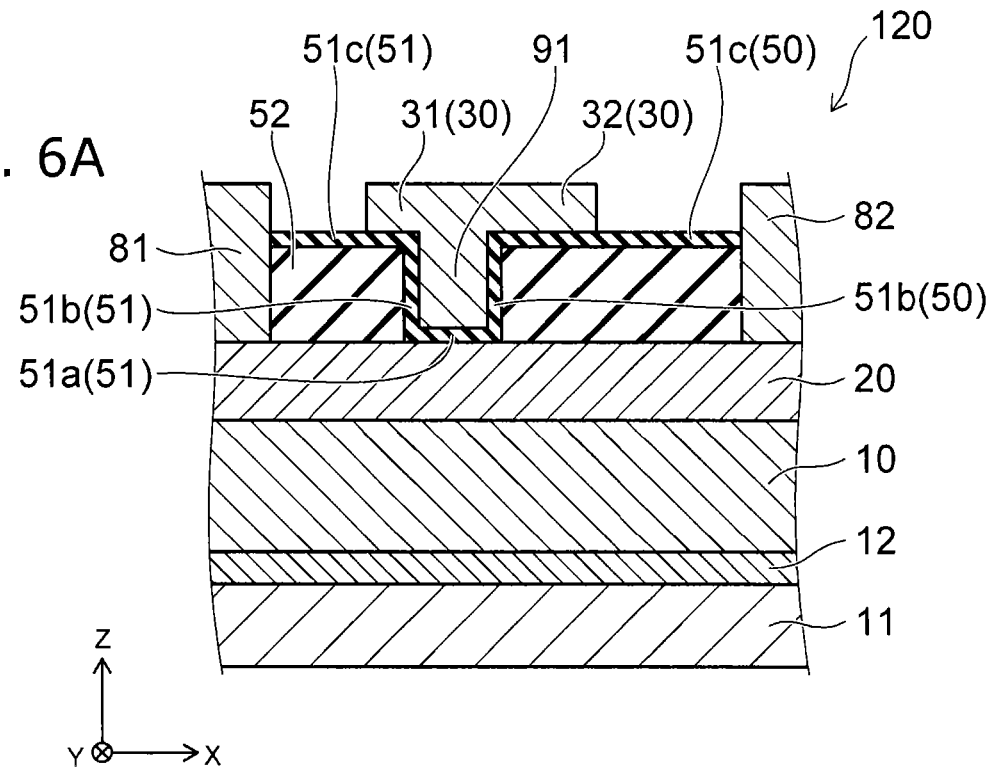
FIGS. 6A and 6B are schematic views showing a semiconductor device according to a second embodiment.
Figure 6B:
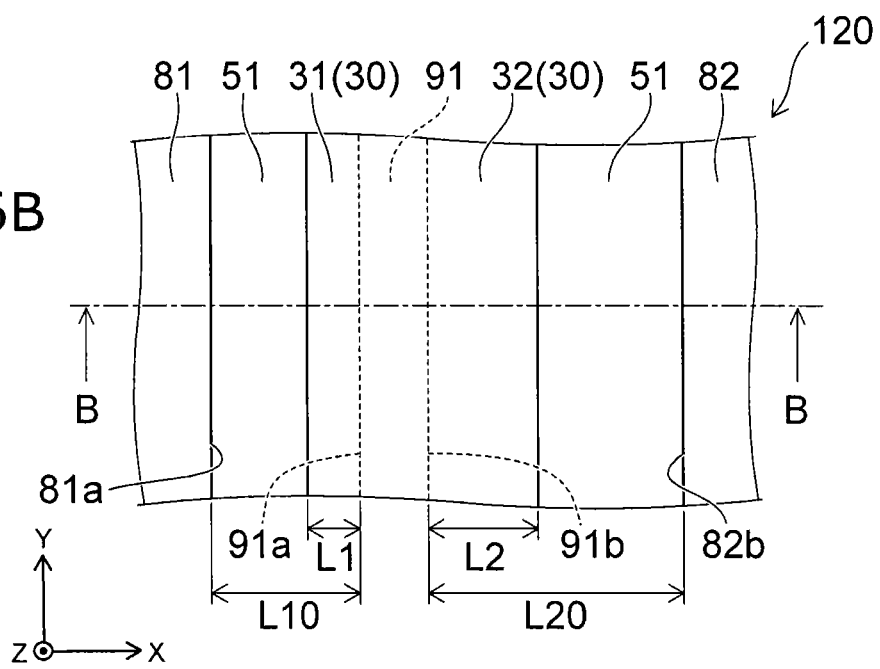

FIGS. 6A and 6B are schematic views showing a semiconductor device according to a second embodiment.

FIG. 6A shows a schematic cross-sectional view of the semiconductor device 120. FIG. 6A is a schematic cross-sectional view along line B-B of FIG. 6B. FIG. 6B is a schematic plan view of the semiconductor device 120.

As shown in FIG. 6A, the semiconductor device 120 includes the first nitride semiconductor layer 10, the second nitride semiconductor layer 20, the first electrode 81, the second electrode 82, the first insulating film 51, the first control electrode 91, the second insulating film 52, and the extended electrode 30. The semiconductor device 120 is, for example, a HEMT that uses a nitride semiconductor. The configuration of the first insulating film 51 of the semiconductor device 120 is different from that of the semiconductor device 110.

As shown in FIG. 6A, the first insulating film 51 of the semiconductor device 120 includes a first portion 51a, a second portion 51b, and a third portion 51c. The first portion 51a is provided between the first control electrode 91 and the second nitride semiconductor layer 20. The second portion 51b is provided between the first control electrode 91 and the second insulating film 52. The third portion 51c is provided on the second insulating film 52. The semiconductor device 120 has a recessed gate structure in which the first control electrode 91 is provided in a recess 52h (a recessed region) provided in the second insulating film 52.

An increase of the ESD immunity is achieved as in the first control electrode 91 of the semiconductor device 120 by applying the recessed gate structure. Even in the case where the recessed gate structure is applied, the transconductance does not fluctuate; and the increase of the on-resistance caused by the current collapse does not occur.

An extended electrode 30 that is similar to that of the semiconductor device 110 is provided in the semiconductor device 120. The third portion 51c of the first insulating film 51 is provided between the first extended portion 31 of the extended electrode 30 and the second insulating film 52. The third portion 51c of the first insulating film 51 is provided between the second extended portion 32 of the extended electrode 30 and the second insulating film 52.

In the semiconductor device 120, similarly to the semiconductor device 110, the total of the first capacitance C1 and the second capacitance C2 is set to be not less than 1.1 times and not more than 1.4 times the first capacitance C1. For example, in the semiconductor device 120, the first length L1 of the first extended portion 31 of the extended electrode 30 and the second length L2 of the second extended portion 32 are set to satisfy such a relationship between the first capacitance C1 and the second capacitance C2. Thereby, the current collapse due to the electric field relaxation effect due to the field plate electrode structure is suppressed; and the reduction of the switching loss is achieved by suppressing the increase of the parasitic capacitance.

A method for manufacturing the semiconductor device 120 will now be described.

FIG. 7A to FIG. 8C are schematic cross-sectional views showing the method for manufacturing the semiconductor device.

FIG. 7A to FIG. 8C show the method for manufacturing the semiconductor device 120 in the order of the processes.

Figure 7A:
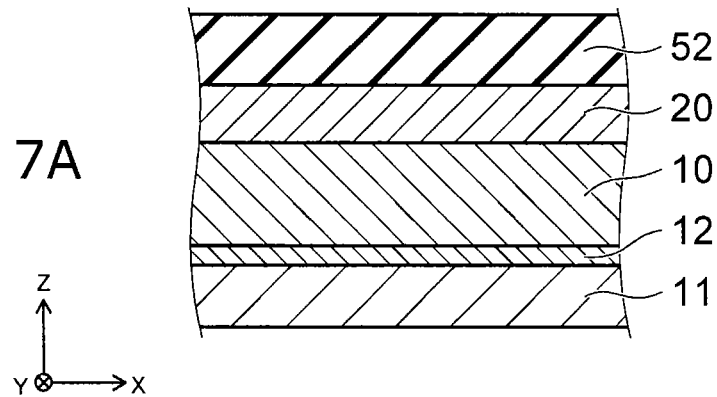
FIG. 7A to FIG. 7C are schematic cross-sectional views showing the method for manufacturing the semiconductor device.

First, as shown in FIG. 7A, the buffer layer 12 is formed on the substrate 11. For example, a stacked structure in which several tens of layers of AlN and GaN are stacked alternately is used as the buffer layer 12.

Then, the first nitride semiconductor layer 10 and the second nitride semiconductor layer 20 are stacked in this order on the buffer layer 12. For example, MOCVD, MBE, or the like is used as the method for forming the nitride semiconductor layers used to form these layers.

Continuing, the second insulating film 52 is formed on the second nitride semiconductor layer 20. The second insulating film 52 includes, for example, SiN. A known CVD method or the like is used as the film formation method of the second insulating film 52.

Figure 7B:
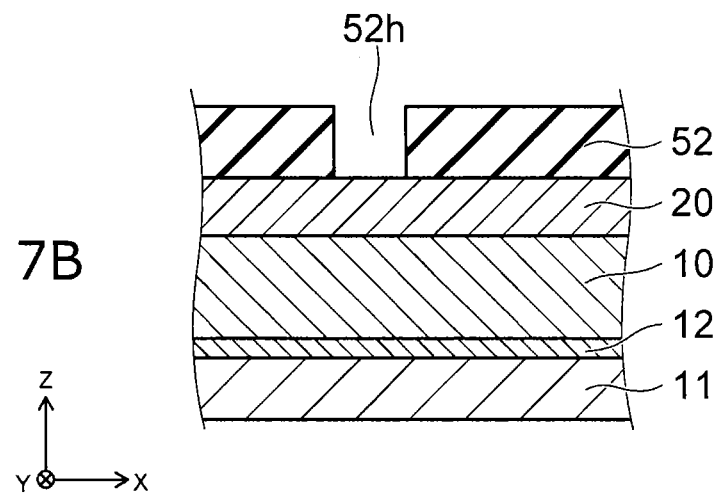

Then, as shown in FIG. 7B, the recess 52h is made by removing a portion of the second insulating film 52. The recess 52h is made by, for example, photolithography and etching. The second nitride semiconductor layer 20 is exposed at the bottom of the recess 52h.

Figure 7C:
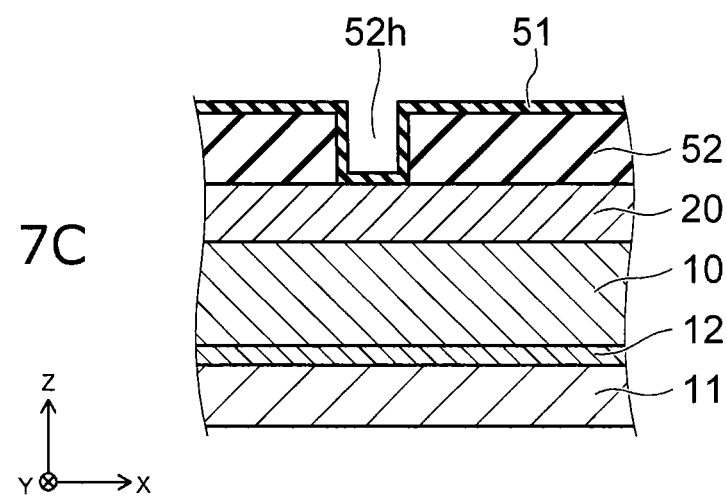

Continuing as shown in FIG. 7C, the first insulating film 51 is formed. The first insulating film 51 includes, for example, $SiO_2$, $Si_3N_4$, and $Al_2O_3$. A known CVD method or the like is used as the film formation method of the first insulating film 51. The first insulating film 51 is formed on the second insulating film 52 and on the inner wall of the recess 52h.

Figure 8A:
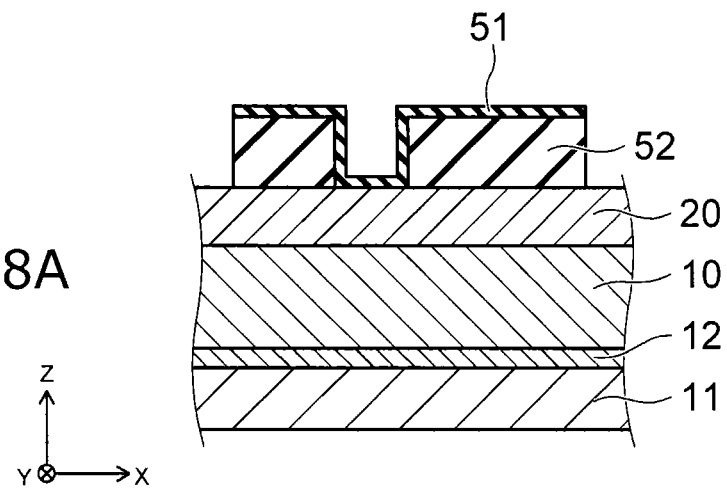
FIG. 8A to FIG. 8C are schematic cross-sectional views showing the method for manufacturing the semiconductor device.

Then, as shown in FIG. 8A, a portion of the first insulating film 51 and a portion of the second insulating film 52 are removed. The portions that are removed are where the first electrode 81 and the second electrode 82 are to be formed.

Figure 8B:
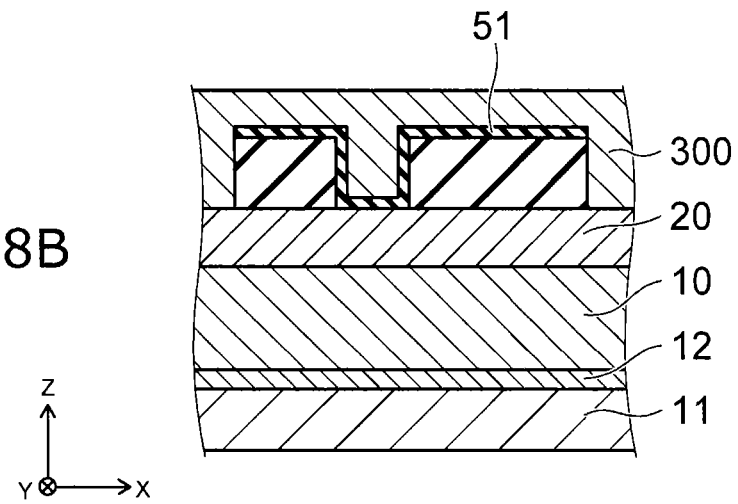

Continuing as shown in FIG. 8B, the electrode material 300 is formed on the first insulating film 51 and the second insulating film 52. The electrode material 300 includes, for example, Ti(bottom)/Pt/Au(top). For example, vapor deposition is used as the method for forming the electrode material 300.

Figure 8C:
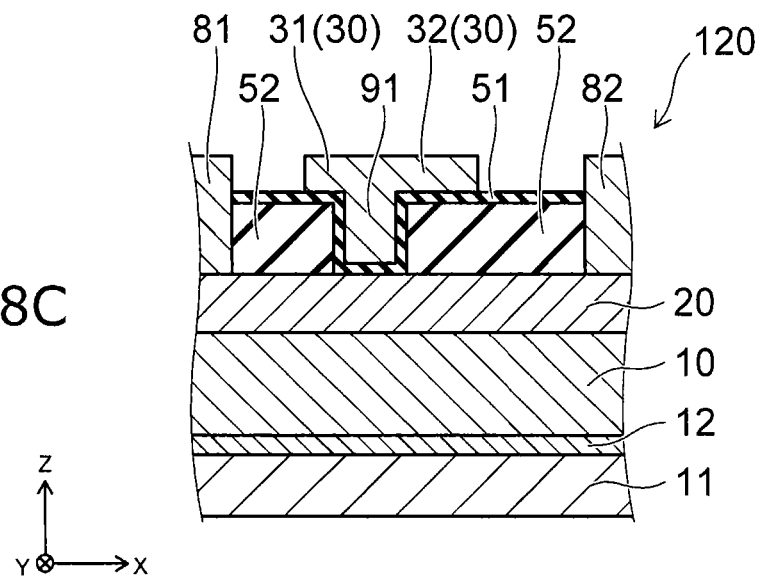

Then, the first electrode 81, the second electrode 82, and the extended electrode 30 are formed as shown in FIG. 8C. Namely, to form the first electrode 81, the second electrode 82, and the extended electrode 30, a portion of the electrode material 300 is removed by, for example, known photolithography and etching methods. The remaining portions of the electrode material 300 that are not removed become the first electrode 81, the second electrode 82, and the extended electrode 30. The first length L1 of the first extended portion 31 and the second length L2 of the second extended portion 32 are determined by the photolithography and etching of the electrode material 300. Thereby, the semiconductor device 120 is completed.

Third Embodiment

A third embodiment will now be described.

Figure 9:
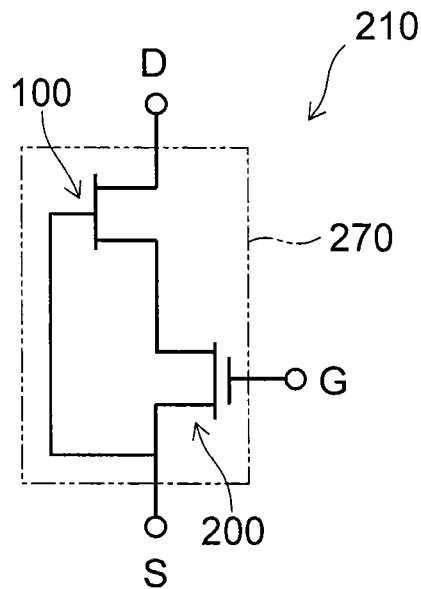
FIG. 9 is a circuit diagram showing a semiconductor device according to a third embodiment.

FIG. 9 is a circuit diagram showing a semiconductor device according to a third embodiment.

Figure 10:
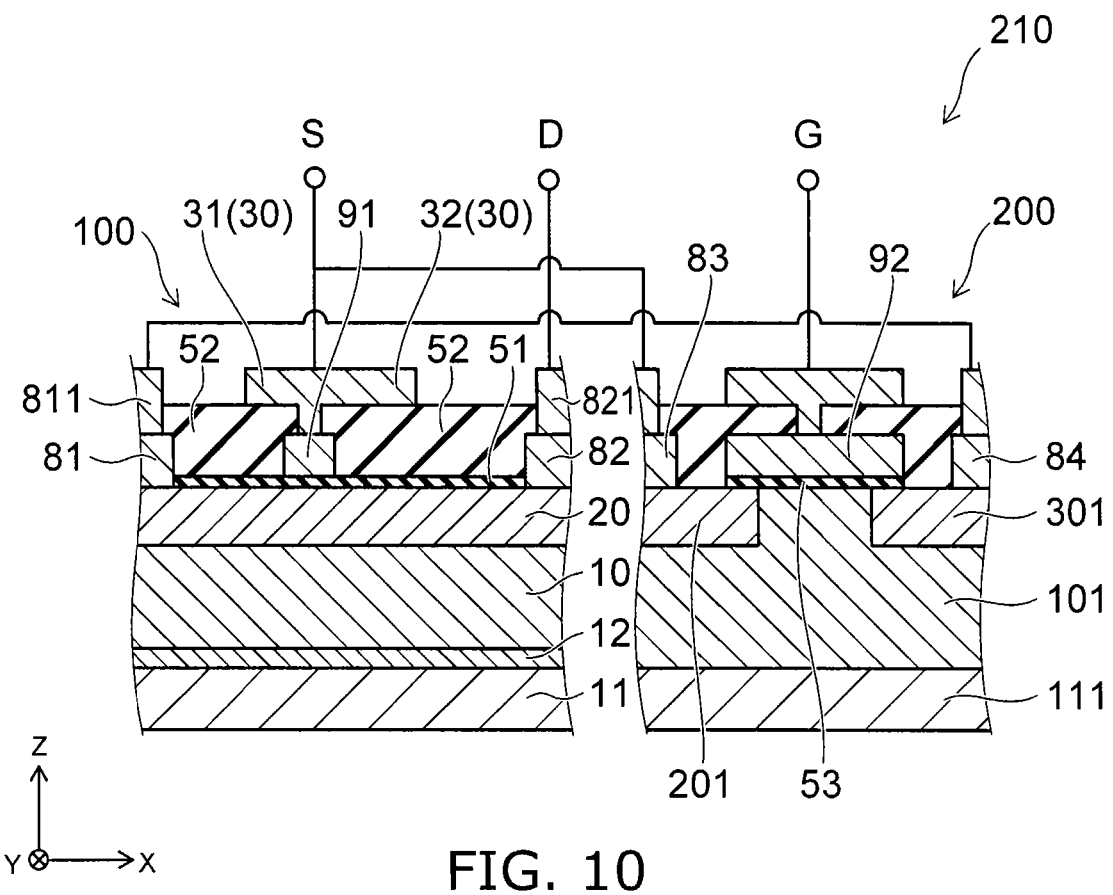
FIG. 10 is a schematic cross-sectional view showing the semiconductor device according to the third embodiment.

FIG. 10 is a schematic cross-sectional view showing the semiconductor device according to the third embodiment.

FIG. 10 is a schematic cross-sectional view of a first semiconductor device 100 and a second semiconductor device 200. FIG. 10 also shows the interconnects between the first semiconductor device 100 and the second semiconductor device 200 for convenience of description.

As shown in FIG. 9, the semiconductor device 210 includes the first semiconductor device 100 and the second semiconductor device 200. The first semiconductor device 100 is at least one selected from the semiconductor devices 110 and 120 described above. The first semiconductor device 100 has a cascode connection to the second semiconductor device 200. The semiconductor device 210 is a three-terminal element (transistor) in which the first semiconductor device 100 and the second semiconductor device 200 are combined.

The first semiconductor device 100 and the second semiconductor device 200 are, for example, components having chip configurations. The first semiconductor device 100 and the second semiconductor device 200 are sealed with a package 270 of a resin, etc. Multiple leads (not shown) from inside the package 270 toward the outside are provided. The multiple leads correspond to the three terminals (e.g., a source electrode S, a drain electrode D, and a gate electrode G) of the transistor.

As shown in FIG. 10, the first semiconductor device 100 includes the first nitride semiconductor layer 10, the second nitride semiconductor layer 20, the first electrode 81, the second electrode 82, the first insulating film 51, the first control electrode 91, the second insulating film 52, and the extended electrode 30. The semiconductor device 110 shown in FIGS. 1A and 1B is applied to the first semiconductor device 100. The semiconductor device 120 shown in FIGS. 6A and 6B is applicable to the first semiconductor device 100.

The second semiconductor device 200 includes a first semiconductor region 101, a second semiconductor region 201, a third semiconductor region 301, a third electrode 83, a fourth electrode 84, a third insulating film 53, and a second control electrode 92. The second semiconductor device 200 is, for example, a MOSFET (Metal Oxide Semiconductor Field Effect Transistor).

The conductivity type of the first semiconductor region 101 is the first conductivity type. The first semiconductor region 101 includes, for example, Si. The first semiconductor region 101 is provided on a substrate 111. The substrate 111 and the substrate 11 of the first semiconductor device 100 may be a common substrate.

The second semiconductor region 201 is provided on the first semiconductor region 101. The conductivity type of the second semiconductor region 201 is the second conductivity type. The second semiconductor region 201 includes, for example, Si. The third semiconductor region 301 is provided on the first semiconductor region 101. The third semiconductor region 301 is provided to be distal to the second semiconductor region 201. The conductivity type of the third semiconductor region 301 is the second conductivity type. The third semiconductor region 301 includes, for example, Si.

The second semiconductor region 201 is, for example, a source region of the MOSFET. The third electrode 83 is electrically connected to the second semiconductor region 201. The third electrode 83 is, for example, a source electrode of the MOSFET.

The third semiconductor region 301 is, for example, a drain region of the MOSFET. The fourth electrode 84 is electrically connected to the third semiconductor region 301. The fourth electrode 84 is, for example, a drain electrode of the MOSFET.

The third electrode 83 of the second semiconductor device 200 is electrically connected to the first control electrode 91 of the first semiconductor device 100. The fourth electrode 84 of the second semiconductor device 200 is electrically connected to the first electrode 81 of the first semiconductor device 100. Thereby, the first semiconductor device 100 has a cascode connection to the second semiconductor device 200.

In the semiconductor device 210, the second control electrode 92 of the second semiconductor device 200 is used as the gate electrode G of the transistor. In the semiconductor device 210, the first control electrode 91 of the first semiconductor device 100 and the third electrode 83 of the second semiconductor device 200 are used as the source electrode S of the transistor. In the semiconductor device 210, the second electrode 82 of the first semiconductor device 100 is used as the drain electrode D of the transistor.

For example, even in the case where the first semiconductor device 100 is a normally-on transistor, the semiconductor device 210 functions as a normally-off transistor due to such a cascode connection.

The second semiconductor device 200 is, for example, a lateral MOSFET. In the embodiment, the second semiconductor device 200 may be a longitudinal MOSFET. In a longitudinal MOSFET, a drain electrode is arranged with a source electrode in the Z-direction.

Operations of the semiconductor device 210 will now be described.

When a voltage that is the threshold of the second semiconductor device 200 or more is applied to the gate electrode G in the state in which a voltage that is positive with respect to the source electrode S is applied to the drain electrode D, the second semiconductor device 200 is switched to the on-state. The potential of the drain electrode D is equal to the potential of the first control electrode 91 of the first semiconductor device 100. Accordingly, when the second semiconductor device 200 is in the on-state, the first semiconductor device 100 also is in the on-state. Thereby, a current flows from the drain electrode D of the semiconductor device 210 toward the source electrode S of the semiconductor device 210.

On the other hand, when the voltage that is applied to the gate electrode G is less than the threshold of the second semiconductor device 200, the second semiconductor device 200 is switched to the off-state. At this time, even if the first semiconductor device 100 is in the on-state, the current flowing from the drain electrode D toward the source electrode S is interrupted by the off-state of the second semiconductor device 200.

In the semiconductor device 210, the voltage that is applied to the drain electrode D becomes voltage stress applied to the first control electrode 91 of the first semiconductor device 100. By applying the semiconductor device 110 or the semiconductor device 120 as the first semiconductor device 100, the reduction of the current collapse is achieved for the voltage stress applied to the first control electrode 91. Also, by applying the semiconductor device 110 or the semiconductor device 120 as the first semiconductor device 100, the increase of the switching loss is suppressed.

As described above, according to the semiconductor device according to the embodiment, both the suppression of the current collapse and the reduction of the switching loss can be realized.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

In the specification, "nitride semiconductor" includes all compositions of semiconductors of the chemical formula $B_\alpha In_\beta Al_\gamma Ga_{1-\alpha-\beta-\gamma}N$ ($0 \leq \alpha \leq 1$, $0 \leq \beta \leq 1$, $0 \leq \gamma \leq 1$, and $\alpha+\beta+\gamma \leq 1$) for which the composition ratios $\alpha$, $\beta$, and $\gamma$ are changed within the ranges respectively. "Nitride semiconductor" further includes group V elements other than N (nitrogen) in the chemical formula recited above, various elements added to control various properties such as the conductivity type and the like, and various elements included unintentionally.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first nitride semiconductor layer;
a second nitride semiconductor layer provided on the first nitride semiconductor layer, a bandgap of the second nitride semiconductor layer being not less than a bandgap of the first nitride semiconductor layer;
a first electrode provided on the second nitride semiconductor layer;
a second electrode provided on the second nitride semiconductor layer and separated from the first electrode;
a first insulating film provided on the second nitride semiconductor layer;
a first control electrode provided on the first insulating film between the first electrode and the second electrode, the first control electrode including
a first edge, and
a second edge separated from the first edge,
a distance between the first control electrode and the first electrode being shorter than a distance between the first control electrode and the second electrode,
the first edge being provided between the second edge and the first electrode in a first direction from the first electrode toward the second electrode;
a second insulating film provided between the first control electrode and the first electrode and between the first control electrode and the second electrode; and
a conductor provided on the second insulating film, the conductor including
a first portion having a first length in the first direction, and
a third edge positioned between the first portion and the first electrode in the first direction,
an electric field strength at a first region being substantially equal to an electric field strength at a second region, the first region overlapping the first edge when projected onto a plane perpendicular to a second direction from the first nitride semiconductor layer toward the second nitride semiconductor layer, the second region overlapping the third edge when projected onto the plane.

2. The device according to claim 1, wherein
a first capacitance is formed between the first control electrode and the second nitride semiconductor layer,
a second capacitance is formed between the conductor and the second nitride semiconductor layer, and
a total of the first capacitance and the second capacitance is not less than 1.1 times and not more than 1.4 times the first capacitance.

3. The device according to claim 1, wherein the conductor includes a second portion having a second length in a direction from the first control electrode toward the second electrode.

4. The device according to claim 3, wherein the first length is shorter than the second length.

5. The device according to claim 1, wherein a film thickness of the second insulating film is 100 nanometers or more.

6. The device according to claim 1, wherein the first length is 2 micrometers or less.

7. The device according to claim 1, wherein
the first nitride semiconductor layer includes $Al_wGa_{1-w-x}In_xN$ ($0 \le w<1$, $0 \le x \le 1$, and $0 \le w+x \le 1$), and
the second nitride semiconductor layer includes $Al_yGa_{1-y-z}In_zN$ ($0<y \le 1$, $0 \le z<1$, and $0 \le y+z \le 1$).

8. The device according to claim 1, wherein the first insulating film further includes a portion provided between the first control electrode and the second insulating film.

9. The device according to claim 1, wherein the first insulating film includes one selected from the group consisting of $SiO_2$, $Si_3N_4$, and $Al_2O_3$.

10. The device according to claim 1, wherein the second insulating film includes one selected from the group consisting of SiN, SiON, and $SiO_2$.

11. The device according to claim 1, further comprising a substrate,
the first nitride semiconductor layer being provided on the substrate.

12. The device according to claim 11, wherein the substrate includes one selected from the group consisting of silicon, sapphire, silicon carbide, gallium nitride, aluminum nitride, and gallium oxide.

13. The device according to claim 11, further comprising an intermediate layer provided between the substrate and the first nitride semiconductor layer.

14. The device according to claim 1, wherein a thickness of the first nitride semiconductor layer is not less than 0.1 micrometers and not more than 10 micrometers.

15. The device according to claim 1, wherein a thickness of the second nitride semiconductor layer is not less than 1 nanometer and not more than 50 nanometers.

16. A semiconductor device, comprising:
a first nitride semiconductor layer;
a second nitride semiconductor layer provided on the first nitride semiconductor layer, a bandgap of the second nitride semiconductor layer being not less than a bandgap of the first nitride semiconductor layer;
a first electrode provided on the second nitride semiconductor layer;
a second electrode provided on the second nitride semiconductor layer and separated from the first electrode;
a first insulating film provided on the second nitride semiconductor layer;
a first control electrode provided on the first insulating film between the first electrode and the second electrode, the first control electrode including
a first edge, and
a second edge separated from the first edge,
a first capacitance being formed between the first control electrode and the second nitride semiconductor layer, a distance between the first control electrode and the first electrode being shorter than a distance between the first control electrode and the second electrode, the first edge being provided between the second edge and the first electrode in a first direction from the first electrode toward the second electrode;

a second insulating film provided between the first control electrode and the first electrode and between the first control electrode and the second electrode; and, a conductor provided on the second insulating film, the conductor including a first portion having a first length in the first direction, a second capacitance being formed between the conductor and the second nitride semiconductor layer, a total of the first capacitance and the second capacitance being not less than 1.1 times and not more than 1.4 times the first capacitance.

17. A semiconductor device, comprising:
a first semiconductor device; and
a second semiconductor device,
the first semiconductor device including a first nitride semiconductor layer, a second nitride semiconductor layer provided on the first nitride semiconductor layer, a first electrode provided on the second nitride semiconductor layer, a second electrode provided on the second nitride semiconductor layer and separated from the first electrode, a first insulating film provided on the second nitride semiconductor layer, a first control electrode provided on the first insulating film between the first electrode and the second electrode, a second insulating film provided between the first control electrode and the first electrode and between the first control electrode and the second electrode, and a conductor provided on the second insulating film, a bandgap of the second nitride semiconductor layer being not less than a bandgap of the first nitride semiconductor layer, the first control electrode including a first edge and a second edge, the second edge being separated from the first edge, a distance between the first control electrode and the first electrode being shorter than a distance between the first control electrode and the second electrode, the first edge being provided between the second edge and the first electrode in a first direction from the first electrode toward the second electrode, the conductor including a first portion and a third edge, the first portion having a first length in the first direction, the third edge being positioned between the first portion and the first electrode in the first direction, an electric field strength at a first region being substantially equal to an electric field strength at a second region, the first region overlapping the first edge when projected onto a plane perpendicular to a second direction from the first nitride semiconductor layer toward the second nitride semiconductor layer, the second region overlapping the third edge when projected onto the plane, the second semiconductor device including a first semiconductor region of a first conductivity type, a second semiconductor region of a second conductivity type, a third semiconductor region of the second conductivity type, a third electrode, a fourth electrode, a third insulating film provided on the first semiconductor region, and a second control electrode provided on the third insulating film, the second semiconductor region being provided at the first semiconductor region, the third semiconductor region being provided at the first semiconductor region and separated from the second semiconductor region, the third electrode being electrically connected to the second semiconductor region and electrically connected to the first control electrode, the fourth electrode being electrically connected to the third semiconductor region and electrically connected to the first electrode.

18. The semiconductor device according to claim 17, wherein
a first capacitance is formed between the first control electrode and the second nitride semiconductor layer,
a second capacitance is formed between the conductor and the second nitride semiconductor layer, and
a total of a first capacitance and a second capacitance is not less than 1.1 times and not more than 1.4 times the first capacitance.

19. The semiconductor device according to claim 17, wherein
the first semiconductor region includes silicon,
the second semiconductor region includes silicon; and
the third semiconductor region includes silicon.

20. A semiconductor device, comprising:
a first semiconductor device; and
a second semiconductor device,
the first semiconductor device including a first nitride semiconductor layer, a second nitride semiconductor layer provided on the first nitride semiconductor layer, a first electrode provided on the second nitride semiconductor layer, a second electrode provided on the second nitride semiconductor layer and separated from the first electrode, a first insulating film provided on the second nitride semiconductor layer, a first control electrode provided on the first insulating film between the first electrode and the second electrode, a second insulating film provided between the first control electrode and the first electrode and between the first control electrode and the second electrode, and a conductor provided on the second insulating film, a bandgap of the second nitride semiconductor layer being not less than a bandgap of the first nitride semiconductor layer, the first control electrode including a first edge and a second edge, the second edge being separated from the first edge, a first capacitance being formed between the first control electrode and the second nitride semiconductor layer, a distance between the first control electrode and the first electrode being shorter than a distance between the first control electrode and the second electrode, the first edge being provided between the second edge and the first electrode in a first direction from the first electrode toward the second electrode, the conductor including a first portion having a first length in the first direction, a second capacitance being formed between the conductor and the second nitride semiconductor layer, a total of the first capacitance and the second capacitance being not less than 1.1 times and not more than 1.4 times the first capacitance, the second semiconductor device including a first semiconductor region of a first conductivity type, a second semiconductor region of a second conductivity type, a third semiconductor region of the second conductivity type, a third electrode, a fourth electrode, a third insulating film provided on the first semiconductor region, and a second control electrode provided on the third insulating film, the second semiconductor region being provided at the first semiconductor region, the third semiconductor region being provided at the first semiconductor region and separated from the second semiconductor region, the third electrode being electrically connected to the second semiconductor region and electrically connected to the first control electrode, the fourth electrode being electrically connected to the third semiconductor region and electrically connected to the first electrode.

* * * * *